United States Patent [19]

Koo et al.

[11] Patent Number: 5,243,403
[45] Date of Patent: Sep. 7, 1993

[54] THREE-AXIS FIBER OPTIC VECTOR MAGNETOMETER

[75] Inventors: Kee P. Koo, Alexandria, Va.; George H. Sigel, Jr., Oldwick, N.J.; Frank Bucholtz, Crofton, Md.

[73] Assignee: The United States of America as represented by the Secretary of the Navy, Washington, D.C.

[21] Appl. No.: 767,955

[22] Filed: Sep. 30, 1991

[51] Int. Cl.$^5$ .................... G01R 33/032; G02F 1/095
[52] U.S. Cl. ................... 356/345; 250/227.19; 324/244.1
[58] Field of Search ............... 356/345, 350; 324/244.1; 250/227.19

[56] References Cited

U.S. PATENT DOCUMENTS

| | | | |
|---|---|---|---|
| 4,450,406 | 5/1984 | Bobb | 385/11 X |
| 4,588,296 | 5/1986 | Cahill et al. | 356/350 |
| 4,644,273 | 2/1987 | Bobb | 324/244.1 |
| 4,697,146 | 9/1987 | Extance et al. | 324/244.1 |

*Primary Examiner*—Vincent P. McGraw
*Attorney, Agent, or Firm*—George Jameson; Thomas E. McDonnell

[57] ABSTRACT

A three-axis fiber optic vector magnetometer is provided for measuring both the direction and magnitude of a DC or low frequency magnetic field. The magnetometer includes an optical interferometer system including a sensing fiber arm disposed with three respective sensing portions perpendicular to one another and attached to a uni-directional sensor material. The interferometer system also includes a reference fiber arm and a laser light source for generating and introducing a laser light into both of the arms. Respective biasing devices generate a reference AC magnetic bias and a respective reference frequency in the three sensing portions. A detecting device detects a reference light signal from the reference fiber arm and the magnetically altered sensing light signal from the sensing fiber arm and forms an interferometer output signal. Respective separating devices then separate the respective magnetically induced interferometer signals at respective ones of the frequencies and produce a respective output signal indicative thereof. This output signal is thus indicative of the magnetic field strength in the respective direction and a vector sum of the strengths shows the magnetic field direction. Preferably, the sensor material is an annealed amorphous metallic glass strip and the separating means are lock-in amplifiers in their phase sensitive detection modes. The biasing devices are also preferably respective Helmholtz coils and a feedback system is provided for feeding back the output of the respective separating devices to the respective biasing devices.

8 Claims, 1 Drawing Sheet

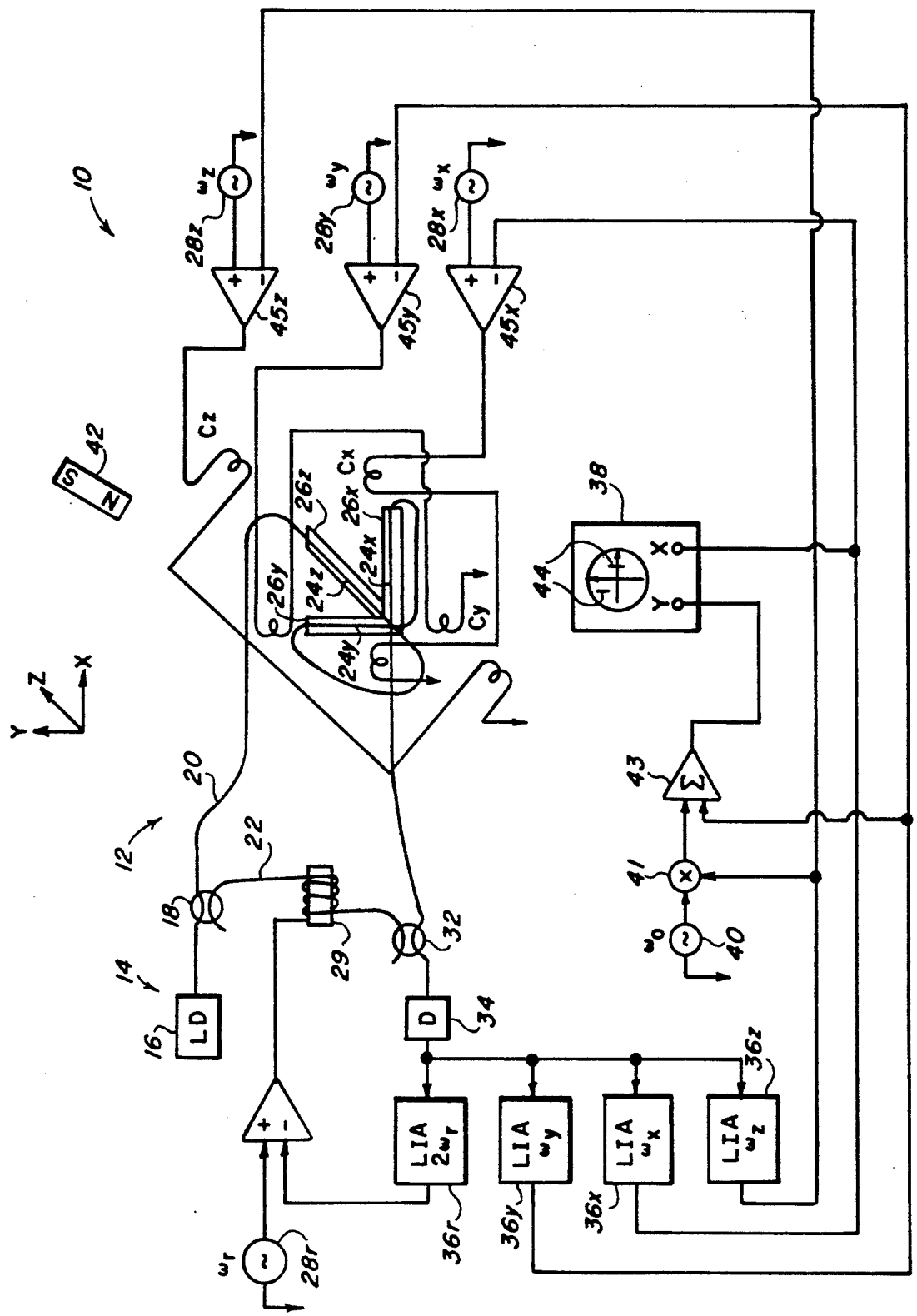

THREE-AXIS FIBER OPTIC VECTOR MAGNETOMETER

FIELD OF THE INVENTION

The present invention relates generally to magnetometers, and more particularly to a three-axis fiber optic vector magnetometer for measuring both the direction and magnitude of a DC or low frequency magnetic field.

BACKGROUND OF THE INVENTION

Sensing of magnetic fields using fiber optic interferometers has been disclosed in the prior art (see, for example: K. P. Koo et al., "Characteristics of Fiber-Optic Magnetic-Field Sensors Employing Metallic Glass," Optics Letters, Vol. 7, pages 334–336 (July 1982); K. P. Koo et al., "A Fiber Optic DC Magnetometer," IEEE, Journal of Lightwave Technology, Vol. LT-1, No. 3, pages 524–525 (September 1983); and K. P. Koo et al., "A Fiber-Optic Magnetic Gradiometer," IEEE, Journal of Lightwave Technology, Vol. LT 1, No. 3, pages 509–513 (September 1983)). In these devices, a two-arm Mach-Zehnder fiber interferometer is used. One of the fiber interferometer arms serves as a magnetic field sensor on which some magnetostrictive material is bonded or deposited. When exposed to a magnetic field, the magnetostrictive material stretches the sensor fiber while the reference fiber remains unaffected. As a result, a magnetically induced differential path length change or phase shift is introduced at the output of the interferometer. However, such fiber optic magnetometers are sensitive only in one given direction of the magnetic field as defined by the orientation of the sensor element.

In U.S. Pat. No. 4,433,291 (Yariv et al.) an optical fiber for magnetostrictive responsive detection of magnetic fields is disclosed. The strength of the protective magnetic field is determined by standard interferometry techniques by comparing the phase or mode properties of the light from a light source exiting the fiber having a magnetostrictive jacket against the phase or mode properties of light from a light source exiting a reference fiber having pre-determined or identical light transmission properties. The sensitivity of magnetic effect upon the magnetostrictively affected fiber is enhanced by subjecting the magnetostrictive material to a quantitative low-level magnetic field.

In Statutory Invention Registration No. H94 (Koo) issued Jul. 1, 1986, an apparatus for increasing sensing linearity and dynamic range of a fiber optic interferometer-type magnetic field sensor is disclosed. A means for generating a magnetic carrier signal having a frequency greater than a magnetic measured field signal is applied to a magnetostrictive sensing element. A reference signal and measured signal are then sensed and an electrical feedback signal is extracted therefrom to achieve an interferometer output signal which is linearized with respect to the D.C. or low frequency magnetic signal.

In U.S. Pat. No. 4,471,219 (Giallorenzi), an amplitude mode magnetic sensor is disclosed. The sensor detects a magnetic field perturbation while nulling out variations in the signal caused by acoustic perturbations. The system uses first and second optical fibers, an adjustable optical coupler for coupling light therebetween, and a magnetic component attached to the optical coupler for observing a mechanical force thereon proportional to a magnetic field perturbation.

In U.S. Pat. No. 4,378,497 (Giallorenzi), an optical fiber magnetic field sensor with thermal and acoustic isolation is disclosed. This isolation is achieved by a housing which is suitable for use with the device disclosed in U.S. Pat. No. 4,433,291 discussed above.

In U.S. Pat. No. 4,376,248 (Giallorenzi et al.), a sensing element for a fiber optic magnetometer is disclosed. The sensing element is a magnetostrictive material associated with an optical fiber and is adapted for use in an optical fiber Mach-Zehnder interferometer. The magnetostrictive material is preferably nickel or metallic glass.

In U.S. Pat. No. 4,109,199 (Pollonov), a three-axis magnetometer provided with a single calibration checking coil lying in a plane disposed at equal angles to each of the three orthogonal axes of sensitivity is disclosed. Energization of the calibration checking coil with a known current while the calibrated magnetometer is in a known condition of calibration provides sensitivity readings for each of the three axes, which readings provide a standard of comparison for checking the calibration and sensitivity of the magnetometer.

In U.S. Pat. No. 4,450,406 (Bobb), a tri-axial optical fiber system for measuring magnetic fields is disclosed. In the system, a set of three fiber-optic coils are positioned along respective orthogonal axes and have predetermined lengths and diameters. A source of polarized light is used for transmitting the light subject to Faraday rotation. In another embodiment, light (not necessarily polarized) is transmitted along respective orthogonal axes through a set of three bifurcated fiber-optic cables each forming a reference branch and a substantially equilaterally sensor branch on which a magnetostrictive material is connected. Photo detectors are used in both embodiments to produce current signals indicative of characteristic changes in the transmitted light.

In U.S. Pat. No. 4,849,696 (Brun et al.), an apparatus for determining the strength and direction of a magnetic field is disclosed. This apparatus includes a toroidal or similar body of a non-magnetic, insulating material which is provided with at least three recesses for receiving one magnetostrictive sensor. The associated measuring directions of the sensors are orthogonal to one another. A coil is arranged on the body for applying a magnetic auxiliary field which increases the accuracy and reliability of the measured result.

In U.S. Pat. No. 4,644,273 (Bobb), a magnetic field gradiometer is disclosed. The gradiometer includes a geometric arrangement of fiber optic sensors through which light from a single frequency laser is transmitted. Each sensor is coupled to a magnetostrictive element in the manner of a Mach-Zehnder interferometer with the sensors oriented in orthogonal directions to detect a particular orthogonal component of a magnetic field.

A brief disclosure of a three-axis magnetometer is also briefly described in Conference Proceedings of the IEEE Lasers and Electro-Optic Society (See F. Bucholtz et al., "Three-axis, Optically-Powered Fiber Optic Magnetometer," Conference Proceedings of IEEE Lasers and Electro-Optic Society 1988 LEOS Annual Meeting Nov. 2–4, 1988, No. OS3.2, pages 279–280. The schematic disclosure was for a remotely-addressable magnetically-dithered, three-axis fiber optic magnetometer which uses an all-optical link for interferometer interrogation and dither power. Separate dither frequencies on each axis are used to demodulate the magnetic information from the single interferometer.

SUMMARY OF THE INVENTION

In accordance with the present invention, a three-axis fiber optic vector magnetometer is provided for measuring both a direction and magnitude of a DC or low frequency magnetic field. The magnetometer includes an optical interferometer system comprising a sensing fiber arm disposed with respective X, Y and Z sensing portions and having longitudinal axes perpendicular to one another. Each sensing portion has a unidirectional sensor material attached thereto. The interferometer system also includes a reference fiber arm and a laser light source means for generating and introducing a laser light into both the reference fiber arm and the sensing fiber arm. Respective X, Y and Z biasing means are provided for generating a reference AC magnetic bias at a respective frequency in the respective X, Y and Z sensing portions. A detecting means then detects a reference light signal from the reference fiber arm and a DC magnetically altered sensing light signal from the sensing fiber arm and forms an interferometer output signal therefrom. Respective X, Y and Z separating means then separate respective DC magnetically induced interferometer signals at respective ones of the frequencies and produce respective X, Y and Z output signals indicative thereof. With these output signals, the DC magnetic field strength in the respective X, Y and Z directions is thus determined, with a vector sum of these strengths determining the magnetic field direction.

In a preferred embodiment, the sensor material is preferably an annealed amorphous metallic glass material mounted to the sensing portions. In addition, the optical interferometer system is a Mach-Zehnder interferometer system.

In the preferred embodiment, the X, Y and Z biasing means are respective Helmholtz coils or solenoids provided around respective X, Y and Z sensing portions. The magnetometer further includes respective X, Y and Z feedback means for feeding back the output of the respective X, Y and Z separating means to respective X, Y and Z biasing means for magnetically nulling the X, Y and Z biasing means. The separating means are preferably respective lock-in amplifiers in phase-sensitive detection modes.

Also in the preferred embodiment, each respective feedback means includes a signal generator having a signal output. Respective summers are then provided for summing respective outputs of the lock-in amplifiers and the signal generators to produce a respective drive signal for each respective Helmholtz coil.

A three dimensional display means for displaying the outputs of the lock-in amplifiers includes a display screen and an input to the display screen for the output of the X lock-in amplifier. To provide for Y and Z display information, a signal generator having a fixed carrier signal is connected to a multiplier by which the output of the Z lock-in amplifier amplitude modulates the fixed carrier signal. A display summer then sums the amplitude modulated signal with the output of the Y lock-in amplifier to produce a summed signal which is inputted to the display screen.

It is an advantage of the present invention that a sensitive material is used that is sensitive only to one direction of magnetic field (uni-directional) so that three separate sensor elements in orthogonal orientations utilizing the sensor material are provided to form a vector magnetometer. The sensor material is preferably an amorphous metallic glass ribbon material which has been properly annealed to have excellent directional selectivity with sensitivity ratio in the two orthogonal directions greater than twenty to one (as shown in the article entitled "Characteristics of Fiber-Optic Magnetic-Field Sensors Employing Metallic Glasses" discussed above).

It is also an advantage of the present invention that a single optical interferometer system is used for simplicity and that electronic signal processing is then used to separate the magnetic signal components of the orthogonal sensors.

It is a further advantage of the present invention that an AC detection scheme (as disclosed in the article entitled "Fiber Optic DC Magnetometer" as discussed above) is used to detect a DC magnetic field.

Still another advantage of the present invention is the use of a magnetic feedback scheme to suppress or overcome magnetic material problems. Such problems include hysteresis, magnetic instability due to magnetic cyclings, and insufficient magnetic linear dynamic range.

Other features and advantages of the present invention are stated in and are apparent from a detailed description of a presently preferred embodiment of the invention found hereinbelow.

BRIEF DESCRIPTION OF THE DRAWING

The single figure is a schematic depiction of a three-axis fiber optic vector magnetometer according to the present invention.

DETAILED DESCRIPTION OF THE PREFERRED EMBODIMENT

With reference now to the drawing in which like numerals represent like elements, a three-axis fiber optic vector magnetometer 10 is depicted. Magnetometer 10 includes an optical interferometer system 12 which is preferably an all-fiber Mach-Zehnder interferometer. Interferometer system 12 includes a laser light source means 14 which preferably includes a laser diode 16. Light from laser diode 16 is conducted to a fiber coupler 18. Fiber coupler 18 is used to couple the light from laser diode 16 into both a sensing fiber arm 20 and a reference fiber arm 22.

Sensing fiber arm 20 includes three straight sensing portions 24x, 24y and 24z which are oriented perpendicular to one another and thus define magnetometer axes X, Y and Z. Each sensing portion 24 is bonded to a respective strip 26x, 26y and 26z of a metallic glass ribbon.

It should be appreciated that strips 26 are made of a metallic glass material because such materials are particularly suited for use in a triple-axis magnetometer by virtue of their uni-directional sensitivity. In general, to enhance the sensitivity of such metallic glass materials to the magnetic field, the material is usually heat-treated or annealed at a temperature close to but below its Curie temperature in the presence of a given magnetic field. The magnetic field should be strong enough to induce a magnetic anisotropy in the finished annealed material. The temperature annealing is used to remove structural stress in the material.

It should also be appreciated that magnetostrictive effect of such metallic glass material arises from the rotation of the magnetization M defined by the built-in magnetic anisotropy (easy axis) toward the applied magnetic field H. Thus, it will be appreciated that a planar metallic glass ribbon in an X-Y plane with an easy axis $H_A$ along the Y-axis and the applied magnetic field H (in the plane of the ribbon) at some angle $\phi$ with respect to the easy axis of the magnetic sample, will serve to illustrate the directional sensitivity. Because of strong demagnetization, the planar metallic glass in the ribbon shape is insensitive to the magnetic field $H_z$ along the Z-axis as far as magnetostriction is concerned. If the fiber is mounted perpendicular to the magnetization M, the observed fiber length change corresponds to the magnetostrictively induced strain E in the X direction. The effective strain due to magnetostriction E is thus proportional to the angle $\theta$ (as disclosed in J. D. Livingston, "Magnetochemical Properties of Amorphous Metals," *Phys. Stat. Sol.*, Number (a)70, page 591, 1982) according to the equation $$E = C(\cos^2\theta - \tfrac{1}{3}) \qquad (1)$$

where
$\cos\theta = H_x/H_A$, for $H_x \leq H_A$,
$H_x = H_A \cos\theta$,
C is a constant, and
$H_A$ is the magnitude of the anisotropy field.

When the applied magnetic field is parallel to the easy axis of the magnetic sample, there is no effective magnetostriction. In the special case of the sensor configuration described here, the magnetostrictive strain is measured at 90° to the easy axis of the magnetic sample. Also, the magnetic sample is subjected to an active magnetic nulling feedback stabilization (as explained subsequently) so that the magnetization vector is virtually colinear with the easy axis of the magnetization sample at all times. Therefore, the magnetic sample is only responding to the magnetic field at right angle to the easy axis of the magnetic sample. In other words, an applied magnetic field of arbitrary orientation is thus a vector sum such that $$\vec{H} = H_x \hat{i} + H_y \hat{j} + H_z \hat{k} \qquad (2)$$

where:
$\hat{i}, \hat{j}$ and $\hat{k}$ are the unit vectors along the X-axis, Y-axis and Z-axis, respectively, and
$H_x$, $H_y$ and $H_z$ are the magnetic field components along the X-axis, Y-axis and Z-axis, respectively.

For a single axis magnetometer, $H_y$ and $H_z$ produce little or no magnetostriction. In order to detect the $H_y$ and $H_z$ components, magnetometer 10 is thus required.

Interferometer system 12 is actively stabilized using a stabilization means similar in concept to that described in Statutory Invention Registration H94 discussed previously and herein incorporated by reference. In particular, the stabilization means includes respective sets of Helmholtz coils Cx, Cy and Cz which are set up in alignment with respective strips 26x, 26y and 26z. As shown, each coil C is excited by a respective signal generator 28x, 28y and 28z operating at different respective frequencies in order to form a biasing means generating a reference AC magnetic bias of respective strips 26x, 26y and 26z.

As shown in the figure, reference fiber arm 22 is stabilized by being wrapped around a PZT (Pb-Zr-Ti) rod 29 which is suitably excited by a signal generator 28r which is operated at a respective frequency different from the frequencies of the other signal generators 28. Reference arm 22 and sensing arm 20 are coupled together with a fiber coupler 32. Fiber coupler 32 then conducts light signals from both sensing arm 20 and reference arm 22 to a detecting means 34. Detecting means 34 detects both the reference light signal and the DC (or low frequency) magnetically altered light signal and forms an interferometer output signal. This interferometer output signal is then conducted to respective lock-in amplifiers 36r, 36x, 36y and 36z. Lock-in amplifiers 36 are in their phase sensitive detection mode and thus separate the magnetically induced interferometer signals at the respective frequencies of signal generators 28r, 28x, 28y and 28z. This detection scheme is an extension of the AC technique described in the Koo et al. article entitled "A Fiber Optic DC Magnetometer" discussed above and herein incorporated by reference.

Lock-in amplifiers 36 thus serve as a separating means for separating respective DC (or low frequency) magnetically induced interferometer signals at respective ones of the frequencies and for producing respective output signals indicative thereof. Thus, the output of lock-in amplifier 36x corresponds to the lock-in frequency of signal generator 28x and represents the magnetic field component $H_x$. Similarly, the outputs of lock-in amplifiers 36y and 36z correspond to the lock-in frequencies of signal generators 28y and 28z, respectively, and thus represent the respective magnetic field components $H_y$ and $H_z$. These magnetic field components $H_x$, $H_y$ and $H_z$, are respectively summed with the outputs of signal generators 28x, 28y and 28z in respective summers 45x, 45y and 45z to produce drive signals for the respective Helmholtz coils Cx, Cy and Cz. Once the respective magnetic field components $H_x$, $H_y$ and $H_z$ are determined, the direction and strength of the magnetic field vector can be calculated, as is well known in the art.

The strength of these signals is conveniently displayed on an oscilloscope 38. As shown, oscilloscope 38 has "X" and "Y" inputs which conveniently receive the signals from lock-in amplifiers 36x and 36y. The display of the oscilloscope 38 thus can easily locate the X-Y point on the reference axes. However, in order to include a "Z" dimension, a fixed carrier signal from a signal generator 40 is amplitude modulated in a multiplier 41 by the signal $H_z$ from lock-in amplifier 36z. The amplitude modulated output of the multiplier 41 is then summed in a summer 43 with the signal from lock-in amplifier 36y. This causes the output of oscilloscope 38 to display the Z strength as a line parallel to the Y axis beginning at the X-Y plotted point. Thus, a three dimensional display is achieved by use of oscilloscope 38.

With reference to the drawing, it will be appreciated that the horizontal and vertical cross lines of the display of oscilloscope 38 correspond to zero vertical Y-axis magnetic field ($H_y = 0$) and zero horizontal-axis magnetic field ($H_x = 0$). A simple dot recorded then represents a zero Z-axis magnetic field ($H_z = 0$). By properly positioning a bar magnet 42 in the vicinity of magnetometer 10, the two different display lines 44 were obtained.

It should also be appreciated that the respective outputs from lock-in amplifiers 36x, 36y and 36z are fed back to the associated one of the magnetic bias coils Cx, Cy, Cz for a magnetic nulling. This results in increased stability and extended linearization of the magnetic response. Further explanations of this feedback scheme are contained in Statutory Invention Registration H-94 discussed above. The signal from lock-in amplifier 36r is similarly used as a feedback with signal generator 28r in a manner well known to those of ordinary skill in the art. More specifically, lock-in amplifier 36r locks onto the second harmonic of signal generator 28r in order to stabilize the optical interferometer system 12 at its quadrature for linear response.

Sensitivity of magnetometer 10 to the strength of a magnetic field should be similar to that of a single axis magnetometer which is projected to be about $10^{-8}$ Oersted (Oe) per meter of fiber per Oerstd of magnetic carrier field. Directional sensitivity would depend on the directional selectivity of the properly prepared metallic glass sensing material and the orthogonality of strips 26x, 26y and 26z.

With magnetometer 10, a multiple-axis fiber optic vector magnetometer that can determine both the strength and planar direction of an external magnetic field has been achieved.

It should also be appreciated that magnetometer 10 includes a magnetic feedback or nulling scheme capable of substantially increasing the dynamic range free from magnetic saturation limitation and suppressing magnetic material instabilities and hysteresis due to magnetic cyclings.

It should also be appreciated that magnetometer 10 makes use of a single optical interferometer in order to minimize potential problems which would arise if multiple interferometers were used. Thus, with magnetometer 10, magnetic signals at orthogonal directions are discriminated using different frequency carriers.

Magnetometer 10 is thus particularly suited for measuring DC or low frequency magnetic field vectors. Further, magnetometer 10 can easily be adapted to a vector gradiometer application.

Thus, while the present invention has been described with respect to an exemplary embodiment thereof, it will be understood by those ordinarily skilled in the art that variations and modifications can be effected within the scope and spirit of the invention.

We claim:

1. A three-axis fiber optic vector magnetometer for measuring both a direction and magnitude of a DC or low frequency magnetic field comprising:
    an optical interferometer system including
        (a) a sensing fiber arm having respective X, Y and Z sensing portions respectively disposed along longitudinal axes perpendicular to one another, each said sensing portion having a uni-directional sensor material attached thereto,
        (b) a reference fiber arm, and
        (c) a laser light source means for generating and introducing a laser light into both of said arms;
    respective X, Y and Z biasing means for generating a reference AC magnetic bias signal at respective reference frequencies in respective said X, Y and Z sensing portions;
    a detecting means for detecting a reference light signal from said reference fiber arm and a magnetically altered sensing light signal from said sensing fiber arm and for forming an interferometer output signal; and
    respective X, Y and Z separating means for separating respective magnetically induced interferometer signals at respective ones of the frequencies and for producing a respective X, Y and Z output signals indicative thereof and hence of the magnetic field strength in X, Y and Z directions with a vector sum of the strengths determining the magnetic field direction.

2. A magnetometer as claimed in claim 1 wherein said sensor material is an annealed amorphous metallic glass material bonded to said sensing portions.

3. A magnetometer as claimed in claim 1 wherein said X, Y and Z biasing means are respective Helmholtz coils provided around respective said X, Y and Z sensing portions; and further including respective X, Y and Z feedback means for feeding back the output of respective X, Y and Z separating means to respective said X, Y and Z biasing means for magnetically nulling said X, Y and Z biasing means.

4. A magnetometer as claimed in claim 3 wherein said X, Y and Z separating means are respective lock-in amplifiers in phase sensitive detection modes.

5. A magnetometer as claimed in claim 4 wherein each respective said feedback means includes a signal generator having a signal output; and further including respective summers for summing respective said outputs of said lock-in amplifiers and said signal generators to produce respective drive signals for said respective Helmholtz coils.

6. A magnetometer as claimed in claim 1 wherein said optical interferometer system is a Mach-Zehnder interferometer system.

7. A magnetometer as claimed in claim 1 wherein said sensor material is a planar ribbon.

8. A three-axis fiber optic vector magnetometer for measuring both a direction and magnitude of a DC or low frequency magnetic field comprising:
    an optical interferometer system including
        (a) a sensing fiber arm having respective X, Y and Z sensing portions respectively disposed along longitudinal axes perpendicular to one another, each said sensing portion having a uni-directional sensor material attached thereto,
        (b) a reference fiber arm, and
        (c) a laser light source means for generating and introducing a laser light into both of said arms;
    respective X, Y and Z biasing means for generating a reference AC magnetic bias signal at respective reference frequencies in respective said X, Y and Z sensing portions;
    a detecting means for detecting a reference light signal from said reference fiber arm and a magnetically altered sensing light signal from said sensing fiber arm and for forming an interferometer output signal; and
    respective X, Y and Z separating means for separating respective magnetically induced interferometer signals at respective ones of the frequencies and for producing a respective X, Y and Z output signals indicative thereof and hence of the magnetic field strength in X, Y and Z directions with a vector sum of the strengths determining the magnetic field direction and wherein:
    said X, Y and Z biasing means are respective Helmholtz coils provided around respective said X, Y and Z sensing portions; and further including respective X, Y and Z feedback means for feeding back the output of respective X, Y and Z separating means to respective said X, Y and Z biasing means for magnetically nulling said X, Y and Z biasing means;
    said X, Y and Z separating means are respective lock-in amplifiers in phase sensitive detection modes;
    each respective said feedback means includes a signal generator having a signal output; and further including respective summers for summing respective said outputs of said lock-in amplifiers and said signal generators to produce respective drive signals for said respective Helmholtz coils, and wherein said magnetometer further includes:

a three dimensional display means for displaying said outputs of said lock-in amplifiers including a display screen, an input to said display screen for said output of said X lock-in amplifier, a signal generator with a fixed carrier signal, a multiplier by which said output of said Z lock-in amplifier amplitude modulates the fixed carrier signal, and a display summer which sums said amplitude modulated signal with said output of said Y lock-in amplifier to produce a summed signal, and an input to said display screen for said summed signal.

* * * * *